United States Patent [19]

Mine et al.

[11] Patent Number: 5,561,329
[45] Date of Patent: Oct. 1, 1996

[54] COMPOSITIONS FOR PROTECTING SEMICONDUCTOR ELEMENTS AND SEMICONDUCTOR DEVICES

[75] Inventors: Katsutoshi Mine; Hiroyoshi Naito; Kimio Yamakawa, all of Chiba, Japan

[73] Assignee: Dow Corning Toray Silicone Co., Ltd., Tokyo, Japan

[21] Appl. No.: 452,760

[22] Filed: May 30, 1995

[30] Foreign Application Priority Data

Jun. 6, 1994 [JP] Japan .................................. 6-147072

[51] Int. Cl.⁶ .............................................. H01L 23/29
[52] U.S. Cl. ..................... 257/788; 257/789; 257/790; 257/791; 257/795; 427/58; 427/96; 427/387; 524/863; 528/12; 528/34
[58] Field of Search ....................... 257/788, 789, 257/790, 791, 795; 427/58, 96, 387; 528/34, 12; 524/863

[56] References Cited

U.S. PATENT DOCUMENTS

| 4,318,939 | 3/1982 | Wong | 257/791 |
|---|---|---|---|
| 4,499,149 | 2/1985 | Berger | 257/788 |
| 4,888,226 | 12/1989 | Wong | 257/788 |
| 5,051,275 | 9/1991 | Wong | 257/788 |
| 5,216,807 | 6/1993 | Yoshizawa et al. | 29/876 |
| 5,246,995 | 9/1993 | Murakami et al. | 524/265 |
| 5,391,924 | 2/1995 | Uchida et al. | 257/789 |
| 5,442,237 | 8/1995 | Hughes et al. | 257/789 |

FOREIGN PATENT DOCUMENTS

| 63-35654 | 2/1988 | Japan . |
|---|---|---|
| 3166262 | 7/1991 | Japan . |

*Primary Examiner*—Mahshid Saadat
*Assistant Examiner*—David Ostrowski
*Attorney, Agent, or Firm*—Robert Spector

[57] ABSTRACT

Curable silicone compositions comprise either (a) microparticles of a fluororesin which exhibits low adhesion to the cured composition, or (b) microparticles of an organic or inorganic material whose surfaces have been coated with this type of fluororesin. The compositions are useful coatings for semiconductor devices requiring high levels of moisture and heat resistance.

5 Claims, 1 Drawing Sheet

1

COMPOSITIONS FOR PROTECTING SEMICONDUCTOR ELEMENTS AND SEMICONDUCTOR DEVICES

BACKGROUND OF THE INVENTION

1. Field of the Invention

This invention relates to compositions for protecting semiconductor elements, hereinafter referred to as protectant compositions, and to semiconductor devices coated with these compositions.

More particularly, this invention relates to protectant compositions that provide highly moisture-resistant and highly heat-resistant semiconductor devices and to semiconductor devices coated with these compositions.

2. Background Information

To protect the semiconductor element(s) in semiconductor devices from such insults as external stresses, alpha-radiation, and the like, the surface of the semiconductor element is typically coated with cured silicone compositions, as described in Laid Open Japanese Patent Application [Kokai or Unexamined] Number Sho 63-35654 [35,654/1988] and Laid Open Japanese Patent Application [Kokai or Unexamined] Number Hei 3-166262 [166,262/1991]). This assembly is then sealed with a molding compound such as an epoxy resin.

Several problems are associated with this type of semiconductor device due to the difference in coefficients of thermal expansion (CTE) between the epoxy resin sealant and the cured silicone material. When the fabricated semiconductor device is tested for its moisture and heat resistance, this CTE mismatch causes such defects as the development of voids or gaps at the interface between the resin sealant and cured silicone and deformation or breakage of the bonding wires—which electrically connect the semiconductor element and lead frame—by internal stresses generated between the resin sealant and the cured silicone.

One objective of the present invention is to provide compositions for protecting semiconductor elements which afford highly moisture-resistant and highly heat-resistant semiconductor devices. An additional objective of the present invention is to provide highly moisture- and heat-resistant semiconductor devices.

SUMMARY OF THE INVENTION

The objectives of the present invention are achieved by the presence in the curable silicone material of either (a) microparticles of a fluororesin, which exhibits low adhesion to the cured composition, or (b) microparticles of an organic or inorganic material whose surfaces have been coated with a fluororesin.

DESCRIPTION OF THE DRAWINGS

The accompanying drawing identified as FIG. 1 is a sectional view of a semiconductor device wherein a semiconductor element is coated with a cured composition of the present invention. The numbers in this figure refer to the following components of the semiconductor device:
1=semiconductor element
2=tab
3=bonding pad
4=copper lead frame
5=gold bonding wire
6=the cured product of the composition used to protect the semiconductor elements; and
7 a cured epoxy resin.

DETAILED DESCRIPTION OF THE INVENTION

Figure 1:
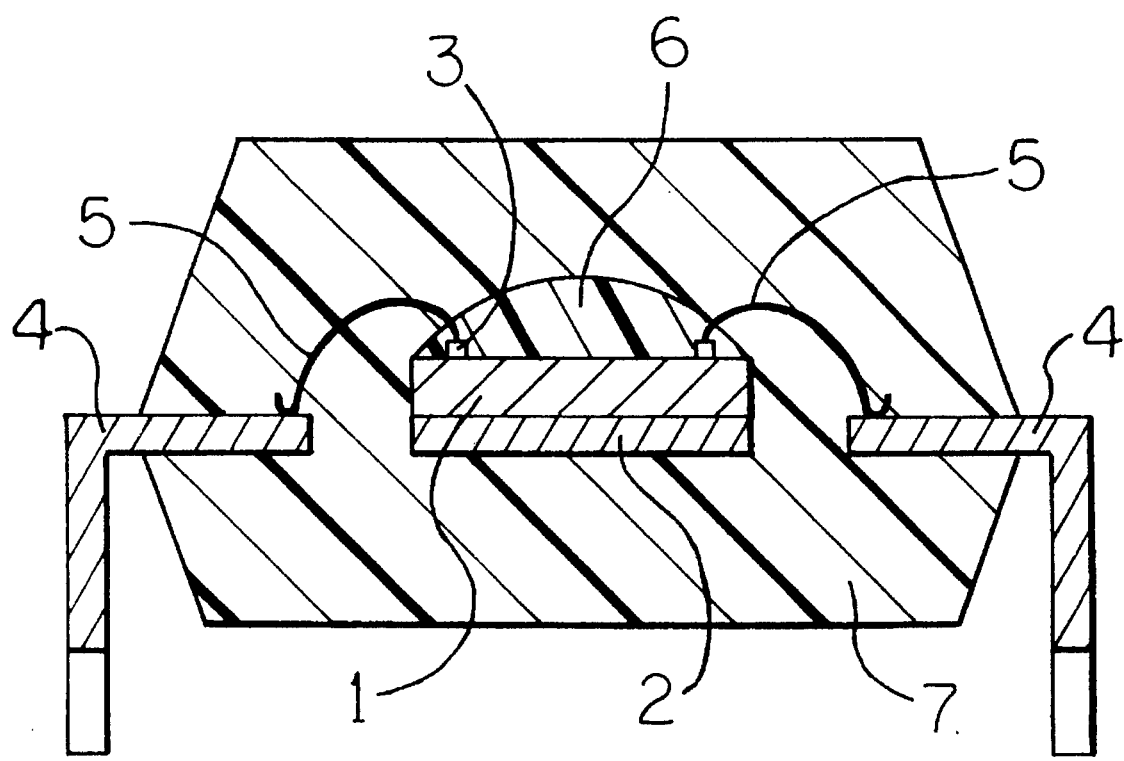

This invention provides a composition for protecting semiconductor elements, said composition comprising
(I) 100 weight parts of a curable silicone composition and
(II) from 1 to 400 weight parts of an additive selected from the group consisting of 1) microparticles of a fluororesin exhibiting an average particle size of from 1 to 200 micrometers and 2) microparticles of an organic or inorganic material exhibiting an average particle size of from 1 to 200 micrometers, wherein the surfaces of said particles are coated with fluororesin.

DETAILED DESCRIPTION OF THE DRAWINGS

FIG. 1 of the accompanying drawings is a cross-sectional view of a semiconductor device wherein an element is protected using a composition of the present invention.

Referring to this drawing, a semiconductor element based on, for example silicon or gallium arsenide is mounted on a tab 2 and the bonding pads 3 formed on the top edges of the semiconductor element 1 are electrically connected to an iron alloy or copper lead frame 4 by copper, aluminum, or gold bonding wires 5.

Within the semiconductor device of the present invention the surface of the semiconductor element 1 is coated with the cured protectant composition 6 and the semiconductor element is additionally resin-sealed with a cured epoxy resin 7 for sealing semiconductor elements.

Semiconductor devices according to the present invention characteristically contain at least one semiconductor element coated with the cured product formed from the present compositions. The ingredients of the protectant composition according to the present invention will now be considered in detail.

Component (I) is the base ingredient of the protectant composition, and it may be, for example, an ultraviolet-curable, addition reaction-curable, condensation reaction-curable, or radical reaction-curable silicone composition. Ultraviolet-curable and addition reaction-curable silicone compositions are particularly preferred for component (I).

UV-curable silicone compositions of this invention are exemplified by curable silicone compositions based on
(a) organopolysiloxanes containing UV-functional groups, which include but are not limited to alkenyl-functional organopolysiloxanes, acrylic-functional organopolysiloxanes, methacrylic-functional organopolysiloxanes, and acrylamide-functional organopolysiloxanes; or
(b) mercaptoalkyl-functional organopolysiloxanes and alkenyl-functional organopolysiloxanes; or
(c) alkenyl-functional organopolysiloxanes and SiH-containing organopolysiloxanes.

Because they provide particularly good protectant compositions, the preferred UV-curable silicone compositions are those based on UV-functional group-containing organopolysiloxanes such as acrylic-functional organopolysiloxanes, methacrylic-functional organopolysiloxanes, and acrylamide-functional organopolysiloxanes.

Curable silicone compositions based on acrylamide-functional organopolysiloxanes are particularly preferred.

Particularly preferred curable silicone compositions based on an acrylamide-functional organopolysiloxane comprise (A) 100 weight parts of an organopolysiloxane containing at least one siloxane unit with the following general formula

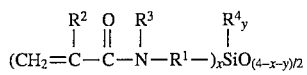

wherein $R^1$ is a divalent hydrocarbon radical; $R^2$ is the hydrogen atom or a monovalent hydrocarbon radical; $R^3$ is the hydrogen atom or a monovalent hydrocarbon radical; $R^4$ selected from group consisting of monovalent hydrocarbon radicals, the hydroxyl group, and alkoxy groups; x is 1, 2, or 3; y is 0, 1, or 2; and (x+y) is 1, 2, or 3; and
(B) 0.01 to 10 weight parts of a photoinitiator.

Component (A), which is the base ingredient of these curable silicone compositions, is an organopolysiloxane containing at least 1 siloxane unit with the following general formula.

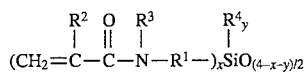

R1 in this formula represents a divalent hydrocarbon radical, and is specifically exemplified but not limited to alkylene radicals such as methylene, ethylene, methylethylene, propylene, methylpropylene and butylene.

Each $R^2$ is individually selected from hydrogen atom and monovalent hydrocarbon radicals. The monovalent hydrocarbon radicals represented by $R^2$ are specifically exemplified by but not limited to alkyl radicals such as methyl, ethyl, propyl and butyl; alkenyl radicals such as vinyl, allyl, butenyl, pentenyl and hexenyl; aryl groups such as phenyl, tolyl, and xylyl; and aralkyl groups such as benzyl and phenethyl.

$R^3$ is selected from the hydrogen atom and monovalent hydrocarbon radicals. The monovalent hydrocarbon radicals represented by $R^3$ are selected from the same monovalent hydrocarbon groups discussed in connection with $R^2$ above.

$R^4$ is selected from the group consisting of monovalent hydrocarbon radicals, the hydroxyl group, and alkoxy groups. The monovalent hydrocarbon radicals encompassed by $R^4$ include the same hydrocarbon groups as discussed in connection with $R^2$ above.

The alkoxy groups represented by $R^4$ are specifically exemplified by methoxy, ethoxy, isopropoxy, n-propoxy, tert-butoxy, and n-butoxy.

With regard to the subscripts in the preceding formula, x can be 1, 2, or 3; y can be 0, 1, or 2; and (x and y) can be 1, 2, or 3.

The following siloxane units are provided as specific examples of the siloxane unit under consideration.

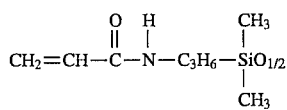

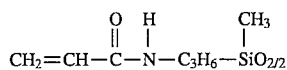

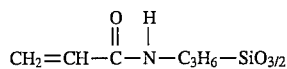

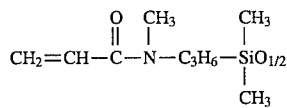

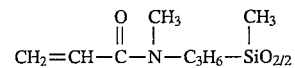

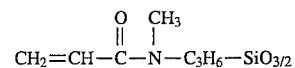

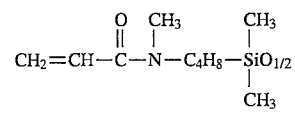

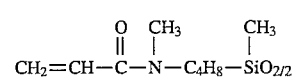

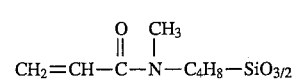

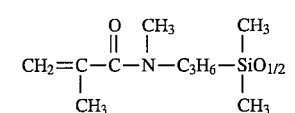

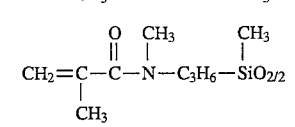

Additional siloxane units that can be present are exemplified by siloxane units with the general formulas $R^2{}_2SiO_{2/2}$, $R^2{}_3SiO_{1/2}$, $R^2SiO_{3/2}$, and $SiO_{4/2}$ and combinations of two or more of these siloxane units. $R^2$ in these general formulas is defined as in the preceding paragraphs.

Component (B) is a photoinitiator whose purpose is to induce curing of the curable silicone composition. Component (B) is specifically exemplified by benzoin and its derivatives, which include but are not limited to benzoin methyl ether, benzoin ethyl ether, benzoin isopropyl ether, and benzoin n-butyl ether; acetophenone and its derivatives, which include but are not limited to dichloroacetophenone, trichloroacetophenone, tert-butyltrichloroacetophenone, 2,2-diethoxyacetophenone, and para-dimethylaminoacetophenone; benzophenone and its derivatives, which include but are not limited to 2-chlorobenzophenone, p,p'-dichlorobenzophenone and p,p'-bisdiethylaminobenzophenone; p-dimethylaminopropiophenone; Michler's ketone; benzil; benzil dimethyl ketal; tetramethylthiuram monosulfide; thioxanthone; 2-chlorothioxanthone; 2-methylthioxanthone; azoisobutyronitrile; benzoin peroxide; di-tert-butyl peroxide; 1-hydroxycyclohexyl phenyl ketone; 2-hydroxy-2-methyl-1-phenyl-1-one; 1-(4-isopropylphenyl)-2-hydroxy-2-methylpropan-1-one; methylbenzoyl formate; diphenyl sulfide; anthracene; 1-chloroanthraquinone; diphenyl disulfide; diacetyl; hexachlorobutadiene; pentachlorobutadiene; octachlorobutadiene; and 1-chloromethylnaphthalene.

The concentration of component (B) must be from 0.01 to 10 weight parts per 100 weight parts component (A). The silicone composition has a substantially reduced curability when the concentration of component (B) is less than 0.01 weight part per 100 weight parts of component A). The heat resistance of the corresponding cured product is substantially reduced when the concentration of component (B) exceeds 10 weight parts per 100 weight parts of component (A).

The curable silicone compositions of this invention may contain a photosensitizer as an optional component insofar as the object of the present invention is toe impaired. Suitable photosensitizers include but are not limited to n-butylamine, di-n-butylamine, tri-n-butylphosphine, allylthiourea, S-benzylisothiuronium p-toluenesulfinate, triethylamine, and diethylaminoethyl methacrylate.

Addition reaction-curable silicone compositions cure in the presence of platinum or a platinum compound by the reaction between alkenyl-functional organopoiysiloxane and SiH-functional organopolysiloxane. Preferred addition reaction-curable silicone compositions comprise (C) 100 weight parts of an organopolysiloxane containing at least 2 alkenyl radicals in each molecule,
(D) an organopolysiloxane containing at least 2 silicon-bonded hydrogen atoms in each molecule, in a quantity that provides 0.5 to 10 silicon-bonded hydrogens from component (D) per alkenyl group in component (C), and
(E) a catalytic amount of platinum or a platinum compound.

Component (C), which is the base ingredient of addition reaction curable silicone compositions, consists of at least one organopolysiloxane containing at least 2 alkenyl radicals in each molecule. The alkenyl radical in component (C) is specifically exemplified by vinyl, allyl, butenyl, pentenyl, hexenyl, and heptenyl, with vinyl being preferred.

The bonding positions for the alkenyl radicals in component (C) are not critical, and these radicals may be bonded, for example, in terminal and/or non-terminal positions. The hydrocarbon radicals other than alkenyl in component (C) include but are not limited to alkyl radicals such as methyl, ethyl, propyl, butyl, pentyl, hexyl, and heptyl; aryl radicals such as phenyl, tolyl, xylyl, and naphthyl; aralkyl radicals such as benzyl and phenethyl; and haloalkyl radicals such as chloromethyl, 3-chloropropyl, and 3,3,3-trifluoropropyl. Methyl and phenyl radicals are preferred.

The molecular structure of component (C) is not critical and is exemplified by straight chain, branched, cyclic, network, and partially branched straight chain. Straight-chain structures are preferred.

Organopolysiloxanes encompassed by component (C) are specifically exemplified by the following: trimethylsiloxy-endblocked dimethylsiloxane-methylvinylsiloxane copolymers; trimethylsiloxy-endblocked methylvinylpolysiloxanes; trimethylsiloxy-endblocked dimethylsiloxane-methylvinylsiloxane-methylphenylsiloxane copolymers; dimethylvinylsiloxy-endblocked dimethylpolysiloxanes; dimethylvinylsiloxy-endblocked methylvinylpolysiloxanes; dimethylvinylsiloxy-endblocked dimethylsiloxane-methylvinylsiloxane copolymers; dimethylvinylsiloxy-endblocked dimethylsiloxane-methylvinyl-siloxane-methylphenylsiloxane copolymers; organopolysiloxane copolymers composed of the $R^5_3SiO_{1/2}$, $R^5_2R^6SiO_{1/2}$, and $SiO_{4/2}$ siloxane units; organopolysiloxane copolymers composed of the $R^5_2R^6SiO_{1/2}$ and $SiO_{4/2}$ siloxane units; organopolysiloxane copolymers composed of the $R^5R^6SiO_{2/2}$ siloxane unit and $R^5SiO_{3/2}$ or $R^6SiO_{3/2}$ siloxane unit; and mixtures of two or more of the preceding organopolysiloxanes.

$R^5$ in these formulas represents monovalent hydrocarbon radicals excluding alkenyl and is specifically exemplified but not limited to alkyl radicals such as methyl, ethyl, propyl, butyl, pentyl, hexyl and heptyl; aryl radicals such as phenyl, tolyl, xylyl, and naphthyl aralkyl radicals such as benzyl and phenethyl; and haloalkyl groups such as chloromethyl, 3-chloropropyl and 3,3,3-trifluoropropyl.

$R^6$ in the preceding formulae represents an alkenyl radical, and is specifically exemplified by vinyl, allyl, butenyl, pentenyl, hexenyl, and heptenyl.

The viscosity of component (C) is not critical, but preferably ranges from 50 to 500,000 centipoise (0.05 to 500 Pa.s) at 25° C., more preferably from 400 to 100,000 centipoise (0.4 to 100 Pa.s) at 25° C. Cured products prepared using the present compositions have a reduced mechanical strength when the viscosity of component (C) at 25° C. is below 50 centipoise (0.05 Pa.s), and the compositions exhibit impaired handling characteristics when this viscosity exceeds 500,000 centipoise (500 Pa.s).

Component (D), which functions as crosslinker for the present addition reaction curable silicone compositions, consists of at least one organopolysiloxane that contains at least 2 silicon-bonded hydrogen atoms in each molecule. The bonding positions for the silicon-bonded hydrogen atoms in component (D) are not critical, and, these groups may be bonded, for example, in terminal and/or non-terminal position. The silicon-bonded organic groups in component (D) are specifically exemplified by but not limited to alkyl radicals such as methyl, ethyl, propyl, butyl, pentyl, hexyl, and heptyl; aryl radicals such as phenyl, tolyl, xylyl, and naphthyl; aralkyl radicals such as benzyl and phenethyl; and haloalkyl radicals such as chloromethyl, 3-chloropropyl, and 3,3,3-trifluoropropyl. Methyl and phenyl radicals are preferred.

The molecular structure of component (D) is not critical and is exemplified by straight chain, branched, cyclic, network, and partially branched straight chain. Straight-chain structures are preferred.

Organopolysiloxanes encompassed by component (D) are specifically exemplified by the following: trimethylsiloxy-endblocked methylhydrogenpolysiloxanes; trimethylsiloxy-endblocked dimethylsiloxane-methylhydrogensiloxane copolymers; trimethylsiloxy-endblocked dimethylsiloxane-methylhydrogensiloxane-methylphenylsiloxane copolymers; dimethylhydrogensiloxy-endblocked dimethylpolysiloxanes; dimethylhydrogensiloxy-endblocked dimethylsiloxane-methylphenylsiloxane copolymers; dimethylhydrogensiloxy-endblocked methylphenylpolysiloxanes; organopolysiloxane copolymers containing $R^5_3SiO_{1/2}$, $R^5_2HSiO_{1/2}$, and $SiO_{4/2}$ units; organopolysiloxane copolymers containing $R^5_2HSiO_{1/2}$ and $SiO_{4/2}$ units; organopolysiloxane copolymers containing $R^5HSiO_{2/2}$ and either $R^5SiO_{3/2}$ or $HSiO_{3/2}$ units; and mixtures of two or more of the preceding organopolysiloxanes.

$R^5$ in these formulae represents monovalent hydrocarbon radicals excluding alkenyl radicals, and is specifically exemplified by but not limited to alkyl such as methyl, ethyl, propyl, butyl, pentyl, hexyl and heptyl; aryl such as phenyl, tolyl, xylyl, and naphthyl; aralkyl such as benzyl and phenethyl; and haloalkyl such as chloromethyl, 3-chloropropyl, and 3,3,3-trifluoropropyl.

The viscosity of component (D) is not critical, but preferably ranges from 1 to 500,000 centipoise (0.001 to 500 Pa.s) at 25° C., more preferably from 5 to 100,000 centipoise (0.005 to 10 Pa.s) at 25° C. Cured products prepared using the present compositions have reduced mechanical strength when the viscosity of component (D) at 25° C. is below 1 centipoise (0.001 Pa.s); the corresponding curable silicone composition exhibits reduced handling characteristics when this viscosity exceeds 500,000 centipoise (500 Pa.s).

The concentration of component (D) must provide 0.5 to 10 silicon-bonded hydrogen atom from this component per alkenyl radical in component (C). The curable silicone composition will not undergo acceptable curing when component (D) furnishes less than 0.5 silicon-bonded hydrogen per alkenyl radical in component (C). The cured product suffers from a substantially reduced heat resistance when component (D) furnishes more than 10 silicon-bonded hydrogens per alkenyl radical in component (C).

Component (E), which consists of platinum or a platinum compound, is a catalyst that promotes crosslinking of the present silicone compositions. This component is specifically exemplified by but not limited to very finely divided platinum, platinum black, platinum supported on silica microparticles, platinum supported on active carbon, chloroplatinic acid, platinum tetrachloride, alcohol solutions of chloroplatinic acid, platinum/olefin complexes, complexes between platinum and alkenylsiloxanes such as 1,1,3,3-tetramethyl-1,3-divinyldisiloxane, and particles of a thermoplastic resin powder with a particle size below 10 micrometers that contain platinum or a platinum compound as described above.

Examples of suitable thermoplastic resins include but not limited to polystyrene, polyamides, polycarbonates, and silicones.

The concentration of component (E) in the present compositions is preferably equivalent to from 0.1 to 500 parts by weight of platinum metal per million parts curable silicone composition, more preferably 50 weight-ppm platinum metal.

The curable silicone composition has a substantially reduced curability when component (E) is added in a quantity that furnishes less than 0.1 weight-ppm platinum metal to the curable silicone composition. Additions in excess of 500 ppm of platinum are economically undesirable because they do not provide any significant additional effect.

Insofar as the objects of the invention are not impaired, a cure inhibitor may be added to subject curable silicone composition as an optional component in order to improve the storage stability and handling characteristics of the curable silicone composition. Useful cure inhibitors are exemplified by but not limited to alkyne alcohols such as 3-methyl-1-butyn-3-ol, 3,5-dimethyl-1-hexyn-3-ol and phenylbutynol: ene-yne compounds such as 3-methyl-3-penten-1-yne, as 3,5-dimethyl-3-hexen-1-yne; and by 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole.

The concentration of cure inhibitor is preferably from 10 to 50,000 parts by weight per million parts by weight of curable composition.

Component (II), the characterizing ingredient of the present composition, encompasses microparticles of a fluororesin with an average particle size of 1 to 200 micrometers and organic and inorganic microparticles whose surfaces are coated with fluororesin [hereinafter referred to as fluororesin-coated (in)organic microparticles] and that have an average particle size of 1 to 200 micrometers.

The viscosity of the curable composition is substantially increased and its handling characteristics are substantially impaired when component (I) is blended with fluororesin microparticles or fluororesin-coated (in)organic microparticles having an average particle size below 1 micrometer. At the other extreme, fluororesin microparticles and fluororesin-coated (in)organic microparticles with an average particle size in excess of 200 micrometers cannot be homogeneously blended into component (I). The shape of component (II) is not critical, and, for example, this component may have an irregular shape or take the form of beads, flakes, or fibers, wherein an irregular shape and beads are preferred.

Component (II) is specifically exemplified by but not limited to particles prepared from polytetrafluoroethylene, tetrafluoroethylene-hexafluoropropene copolymers, and polyfluoroalkoxy fluororesins, and by organic microparticles, silica microparticles, and titanium oxide microparticles whose surfaces have been coated with these fluororesins.

Organic materials from which microparticles can be prepared are exemplified by but not limited to nylon, polystyrene, butadiene rubber and polycarbonates. The specific gravity of component (II) preferably does not exceed 5, because this makes possible the preparation of a homogeneous dispersion in component (I) that resists phase separation with the passage of time.

The concentration of component (II) must be from 1 to 400 weight parts per 100 weight parts of component (I). The objectives of the invention are not be achieved when the concentration of component (II) is less than 1 weight part per 100 weight parts component (I), and the composition exhibits substantially reduced handling characteristics when the concentration of component (II) exceeds 400 weight parts per 100 weight parts component (I).

The present compositions are prepared by mixing components (I) and (II) to homogeneity. The method for preparing the composition is not critical, and include but are not limited to mixing components (I) and (II) to homogeneity using a mixing device such as a kneader mixer, planetary mixer, Hobart mixer or two-roll mill.

Components other than components (I) and (II) may be added on an optional basis insofar as the objects of the invention are not impaired. For example, in order to impart adhesiveness to the cured product, alkoxysilanes can be added such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane.

An inorganic filler such as fumed silica, precipitated silica, titanium dioxide, carbon black, alumina, or quartz powder can be added in order to improve the mechanical strength of the final cured product. This includes these inorganic fillers after surface treatment with an organosilicon compound such as organoalkoxysilane, organochlorosilane, organosilazane, and so forth.

Organic solvents can be added in order to improve the handling characteristics. Suitable solvents include but are not limited to hexane, heptane, toluene, xylene, acetone, methyl ethyl ketone, and methyl isobutyl ketone.

When cured on the surface of a semiconductor element, the present protectant compositions produce a cured product in the form of a gel, elastomer, or varnish. All of these forms are able to protect the semiconductor element from external stresses and alpha-radiation.

Semiconductor devices that can be protected using the compositions of the present invention include but are not limited to electronic components in which a semiconductor element such as an IC, hybrid IC, LSI, or other element is mounted. The particular type of semiconductor device is not critical.

No particular limitations apply to methods which may be used to fabricate semiconductor devices according to the present invention. One method for the fabrication of these devices is provided in the following description, referring to FIG. 1 of the accompanying drawing.

The semiconductor element 1 is first bonded on the tab 2 using adhesive; the bonding pads 3 formed on the top edges of semiconductor element 1 are then wire-bonded to the leadframe 4 by bonding wires 5; and the semiconductor element 1 is thereafter covered with the cured protectant composition 6 by coating the surface of the semiconductor element 1 with the protectant composition using a dispenser and curing the composition. The protectant composition dispensed onto the surface of the composition can be cured by exposure to ultraviolet radiation when this composition is an ultraviolet-curable composition, or by standing at room or elevated temperature when it is an addition reaction-curable composition.

After the semiconductor element 1 has been coated with the cured material 6, fabrication of the semiconductor device according to the present invention is then continued by sealing the coated semiconductor element 1 with a curable resin designed for sealing semiconductor elements, such as epoxy resins, polyimide resins, polyether resins, polyphenylene sulfide resins, and liquid crystal polymers.

EXAMPLES

The protectant composition and semiconductor devices according to the present invention are explained in greater detail below using working examples which should not be interpreted as limiting the scope of the invention as defined in the accompanying claims. The viscosity-values reported in the examples were measured at 25° C.

Example 1

The following ingredients were mixed to homogeneity to yield a protectant composition according to the present invention: 2 weight parts 2-hydroxy-2-methyl-1-phenylpropan-1-one, 50 weight parts polytetrafluoroethylene beads exhibiting an average particle size of 50 micrometers, and 100 weight parts of a dimethylsiloxane-methylphenylsiloxane copolymer containing 10 mole percent of methylphenylsiloxane units and exhibiting a viscosity of 5,000 centipoise (5 Pa.s). This dimethylsiloxane-methylphenylsiloxane copolymer was endblocked at one molecular chain terminal with the group

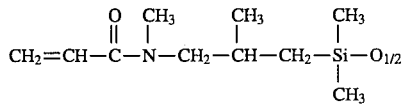

and was endblocked by trimethylsiloxy at the other molecular chain terminal. This protectant composition was completely cured by exposure to the radiation from a high-pressure mercury lamp to yield a soft, elastomeric cured product with a CTE of $2.8 \times 10^{-4}$ (1/° )C.

Referring to FIG. 1, a semiconductor element 1 was then bonded on the surface of a tab 2 using adhesive, and the bonding pads 3 formed on the upper edges of the semiconductor element 1 were electrically connected to the leadframe 4 by bonding wires 5. The protectant composition described in this example was applied from a dispenser onto the surface of the semiconductor element 1 and subsequently completely cured to form coating 6 by exposure to UV radiation from a high-pressure mercury lamp.

The semiconductor element 1 coated with the cured product 6 was then transfer-molded with a transparent thermosetting epoxy resin at 180° C. and then held for 1 hour at 180° C. to give a semiconductor device sealed with cured epoxy resin 7.

Heating the thermosetting epoxy resin by itself at 180° C. for 1 hour yielded a cured epoxy resin with a CTE of $5.0 \times 10^{-5}$ (1/° C.). Twenty semiconductor devices were fabricated by this method.

The fabricated semiconductor devices were each subjected to 100 cycles of thermal cycle testing in which 1 cycle consisted of 30 minutes at −30° C. followed by 30 minutes at 120° C. After cooling to room temperature, the interface between the cured product 6 and the cured epoxy resin 7 in the semiconductor devices was inspected using a stereoscopic microscope. It was thereby confirmed that these interfaces were free of gaps with complete and intimate contact. Partial delamination or separation had occurred at the interfaces between the cured product 6 and the polytetrafluoroethylene beads contained therein with the production of a large number of independent voids. However, no voids or cracks were produced elsewhere, and the bonding wires 5 were free of deformation and breakage.

Comparative Example 1

A protectant composition was prepared as described in Example 1, but in this case using 50 weight parts of spherical silica microparticles exhibiting an average particle size of 50 micrometers in place of the polytetrafluoroethylene beads used in Example 1. This protectant composition, when completely cured by exposure to UV radiation from a high-pressure mercury lamp, gave a cured product with a CTE of $2.6 \times 10^{-4}$ (1/° C.). This protectant composition was also used in the fabrication of 20 semiconductor devices as described in Example 1.

These devices were subjected to thermal cycle testing with the following results:
gaps were present at the interface between the cured composition 6 and cured epoxy resin 7 in all of the semiconductor devices; no delamination or separation was present at the interfaces between the cured composition 6 and the spherical silica microparticles contained therein;
no voids or cracks were produced within the cured composition 6; and
bonding wires 5 were deformed in 3 of the semiconductor devices.

Example 2

The following ingredients were blended to homogeneity to give a protectant composition according to the present invention: 100 weight parts dimethylvinylsiloxy-endblocked dimethylpolysiloxane with a viscosity of 2,000 centipoise (2 Pa.s) and a vinyl content of 0.23 weight %; a trimethylsiloxy-endblocked dimethylsiloxane-methylhydrogensiloxane copolymer with a viscosity of 5 centipoise in sufficient quantity to furnish 0.8 silicon-bonded hydrogen per vinyl radical in the dimethylpolysiloxane; platinum-1, 1,3,3-tetramethyl-1,3-divinyldisiloxane complex, in sufficient quantity to provide the composition with 10 ppm platinum metal in the complex; 1,3,5,7-tetramethyl-1,3,5,7-tetravinyltetracyclosiloxane at 500 ppm in the composition; and 50 weight parts polytetrafluoroethylene beads with an average particle size of 50 micrometers. Complete curing of this protectant composition by heating it for 1 hour in a forced circulation oven at 100° C. yielded a soft, elastomeric cured product with a CTE of $2.9 \times 10^{-4}$ (1/° C.).

A semiconductor element 1 was then bonded on the surface of a tab 2 using a conventional adhesive, and the bonding pads 3 formed on the upper edges of the semiconductor element 1 were electrically connected to the leadframe 4 by bonding wires 5. The protectant composition was applied from a dispenser onto the surface of the semiconductor element 1 and subsequently completely converted into a cured product 6 by heating it for 1 hour in a forced circulation oven at 100° C.

The semiconductor element 1 coated with the cured product 6 was thereafter transfer-molded at 180° C. with the same thermosetting epoxy resin described in Example 1 and then held for 1 hour at 180° C. to give a semiconductor device sealed with cured epoxy resin 7. Twenty semiconductor devices were fabricated by this method.

The fabricated semiconductor devices were each subjected to 100 cycles of thermal cycle testing in which 1 cycle consisted of 30 minutes at −30° C. followed by 30 minutes at 120° C. After cooling to room temperature, the interface between the cured product 6 and the cured epoxy resin 7 in the semiconductor devices was inspected using a stereoscopic microscope. It was thereby confirmed that these interfaces were free of gaps with complete and intimate contact.

Partial delamination or separation had occurred at the interfaces between the cured product 6 and the polytetrafluoroethylene beads contained therein with the production of a large number of independent voids. However, no voids or cracks were produced elsewhere, and the bonding wires 5 were free of deformation and breakage.

Comparative Example 2

A protectant composition was prepared as in Example 2, but in this case using 50 weight parts spherical silica microparticles having an average particle size of 50 micrometers in place of the polytetrafluoroethylene beads of the same size used in Example 2.

Curing by heating in a forced circulation oven for 1 hour at 100° C. gave a completely cured product with a CTE of $2.7 \times 10^{-4}$ (1/° C.). This protectant composition was also used in the fabrication of 20 semiconductor devices as described in Example 2.

These semiconductor devices were subjected to thermal cycle testing with the following results:
gaps were present at the interface between the cured composition 6 and cured epoxy resin 7 in all of the semiconductor devices;
no delamination or separation was present at the interfaces between the cured composition 6 and the spherical silica microparticles contained therein;
no voids or cracks were produced elsewhere; and
bonding wires 5 were deformed in 2 of the semiconductor devices.

That which is claimed is:

1. A composition for protecting semiconductor elements, said composition comprising
(I) 100 weight parts of a curable silicone composition and
(II) from 1 to 400 weight parts of microparticles exhibiting an average particle size of 1 to 200 micrometers selected from the group consisting of fluororesin microparticles, organic microparticles, and inorganic microparticles wherein the surfaces of said organic microparticles and inorganic microparticles are coated with a fluororesin.

2. A composition according to claim 1 wherein component (I) is selected from the group consisting of an ultraviolet-curable silicone composition and an addition reaction-curable silicone composition.

3. A composition according to claim 1 wherein component (I) is an addition reaction-curable silicone composition comprising
(C) 100 weight parts organopolysiloxane that contains at least 2 alkenyl radicals in each molecule,
(D) an organohydrogensiloxane containing at least 2 silicon-bonded hydrogen atoms in each molecule, in a quantity that provides 0.5 to 10 silicon-bonded hydrogens from component (D) per alkenyl group in component (C), and
(E) a catalytic quantity of a catalyst selected from the group consisting of platinum and platinum compounds.

4. A semiconductor device comprising at least one semiconductor element coated with the product obtained by curing the composition of claim 1.

5. A composition for protecting semiconductor elements, said composition comprising
(I) 100 weight parts of a curable silicone composition and
(II) from 1 to 400 weight parts of microparticles exhibiting an average particle size of 1 to 200 micrometers selected from the group consisting of fluororesin microparticles organic microparticles, and inorganic microparticles, wherein the surfaces of said organic microparticles and inorganic microparticles are coated with a fluororesin, and wherein component (I) is an ultraviolet-curable silicone composition comprising
(A) 100 weight parts organopolysiloxane that contains at least one siloxane unit with the following general formula

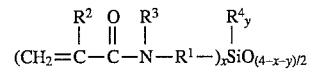

wherein $R^1$ represents a divalent hydrocarbon radical; $R^2$ is a hydrogen atom or a monovalent hydrocarbon radical; $R^3$ is a hydrogen atom or a monovalent hydrocarbon radical; $R^4$ is a group selected from the set consisting of monovalent hydrocarbon radicals, the hydroxyl group, and alkoxy groups; x is 1, 2 or 3; y is 0, 1, or 2; and (x+y) is 1, 2, or 3; and (B) 0.01 to 10 weight parts of a photoinitiator.

* * * * *